United States Patent
Ellä

(10) Patent No.: US 6,278,342 B1
(45) Date of Patent: Aug. 21, 2001

(54) BALANCED FILTER STRUCTURE UTILIZING BULK ACOUSTIC WAVE RESONATORS HAVING DIFFERENT AREAS

(75) Inventor: Juha Ellä, Halikko (FI)

(73) Assignee: Nokia Mobile Phones, Ltd., Espoo (FI)

( * ) Notice: Subject to any disclaimer, the term of this patent is extended or adjusted under 35 U.S.C. 154(b) by 0 days.

(21) Appl. No.: 09/473,395

(22) Filed: Dec. 28, 1999

(30) Foreign Application Priority Data

Dec. 30, 1998 (FI) ........................................... 982824

(51) Int. Cl.[7] .................... H03H 9/54; H03H 9/56
(52) U.S. Cl. ................ 333/189; 333/190; 333/191; 333/192; 310/321; 310/324; 310/366
(58) Field of Search .................... 333/187–192; 310/312, 311, 320, 321, 324, 366

(56) References Cited

U.S. PATENT DOCUMENTS

| | | | |
|---|---|---|---|
| 1,969,571 | * 8/1934 | Mason | 333/190 |
| 5,231,327 | * 7/1993 | Ketcham | 310/366 |
| 5,617,065 | * 4/1997 | Dydyk | 333/186 |
| 5,692,279 | * 12/1997 | Mang et al. | 29/25.35 |
| 5,872,493 | * 2/1999 | Ella | 333/191 |
| 5,942,958 | * 8/1999 | Lakin | 333/189 |
| 6,051,907 | * 4/2000 | Ylilammi | 310/312 |

OTHER PUBLICATIONS

"An Air–Gap Type Piezoelectric Composite Thin Film Resonator" 15 Proc. 39th Annual Symp. Freq. Control, pp. 361–366, 1985, Sotah et al.

"Acoustic Bulk Wave Composite Resonators", Applied Physics Letters, vol. 38, No. 3, pp. 125–127, Feb. 1, 1981, Lakin et al.

\* cited by examiner

Primary Examiner—Benny Lee
Assistant Examiner—Barbara Summons
(74) Attorney, Agent, or Firm—Perman & Green, LLP

(57) ABSTRACT

The invention relates to resonator structures of radio communication apparatus, especially bulk acoustic wave filter structures. According to the invention, a bulk acoustic filter structure is constructed with a lattice configuration, in which two of the filters have a different area than other two for creating very steep passband edges in the frequency response of the filter. Preferably, the filter structure further comprises a second lattice structure for increasing the stopband rejection ratio of the filter structure, and for allowing the use of a simple mechanical structure. The cascaded configuration allows the construction of the filter structure in such a way, that the electrodes of the input and output port are at the same layer, thereby removing the need to make vias in the piezoelectric layer, which results in considerable simplification of the manufacturing process. Preferably, an acoustical mirror structure is used as the acoustical isolation in order to further simplify the mechanical structure of the filter structure.

10 Claims, 8 Drawing Sheets

BALANCED FILTER STRUCTURE UTILIZING BULK ACOUSTIC WAVE RESONATORS HAVING DIFFERENT AREAS

TECHNICAL FIELD OF THE INVENTION

The invention relates to resonator structures of radio communication apparatus, especially bulk acoustic wave filter structures. More specifically, the invention is directed to a radio frequency filter structure described in the preamble of claim 1.

BACKGROUND OF THE INVENTION

The development of mobile telecommunications continues towards ever smaller and increasingly complicated handheld units. The development leads to increasing requirements on the miniaturization of the components and structures used in the mobile communication means. This development concerns radio frequency (RF) filter structures as well, which despite the increasing miniaturization should be able to withstand considerable power levels, have very steep passband edges, and low losses.

The RF filters used in prior art mobile phones are usually discrete surface acoustic wave (SAW) or ceramic filters. Surface acoustic wave (SAW) resonators typically have a structure similar to that shown in FIG. 1. Surface acoustic resonators utilize surface acoustic vibration modes of a solid surface, in which modes the vibration is confined to the surface of the solid, decaying quickly away from the surface. A SAW resonator typically comprises a piezoelectric layer 100, and two electrodes 122, 124. Various resonator structures such as filters are produced with SAW resonators. A SAW resonator has the advantage of having a very small size, but unfortunately cannot withstand high power levels.

It is known to construct thin film bulk acoustic wave resonators on semiconductor wafers, such as silicon (Si) or gallium arsenide (GaAs) wafers. For example, in an article entitled "Acoustic Bulk Wave Composite Resonators", Applied Physics Letters, Vol. 38, No. 3, pp. 125–127, Feb. 1, 1981, by K. M. Lakin and J. S. Wang, an acoustic bulk wave resonator is disclosed which comprises a thin film piezoelectric layers of zinc oxide (ZnO) sputtered over a thin membrane of silicon (Si). Further, in an article entitled "An Air-Gap Type Piezoelectric Composite Thin Film Resonator", I5 Proc. 39th Annual Symp. Freq. Control, pp. 361–366, 1985, by Hiroaki Satoh, Yasuo Ebata, Hitoshi Suzuki, and Choji Narahara, a bulk acoustic wave resonator having a bridge structure is disclosed.

FIG. 2 shows one example of a bulk acoustic wave resonator having a bridge structure. The structure comprises a membrane 130 deposited on a substrate 200. The resonator further comprises a bottom electrode 110 on the membrane, a piezoelectric layer 100, and a top electrode 120. A gap 210 is created between the membrane and the substrate by etching away a sacrificial layer. The gap serves as an acoustic isolator, essentially isolating the vibrating resonator structure from the substrate.

Bulk acoustic wave resonators are not yet in widespread use, partly due to the reason that feasible ways of combining such resonators with other circuitry have not been presented. However, BAW resonators have some advantages as compared to SAW resonators. For example, BAW structures have a better tolerance of high power levels.

In the following, certain types of BAW resonators are described first.

Bulk acoustic wave resonators are typically fabricated on silicon (Si), gallium arsenide (GaAs), glass, or ceramic substrates. One further ceramic substrate type used is alumina. The BAW devices are typically manufactured using various thin film manufacturing techniques, such as for example sputtering, vacuum evaporation or chemical vapor deposition. BAW devices utilize a piezoelectric thin film layer for generating the acoustic bulk waves. The resonance frequencies of typical BAW devices range from 0.5 GHz to 5 GHz, depending on the size and materials of the device. BAW resonators exhibit the typical series and parallel resonances of crystal resonators. The resonance frequencies are determined mainly by the material of the resonator and the dimensions of the layers of the resonator.

A typical BAW resonator consists of three basic elements:

an acoustically active piezoelectric layer, electrodes on opposite sides of the piezoelectric layer, and acoustical isolation from the substrate.

The piezoelectric layer may be for example, ZnO, AlN, ZnS or any other piezoelectric material that can be fabricated as a thin film. As a further example, also ferroelectric ceramics can be used as the piezoelectric material. For example, $PbTiO_3$ and $Pb(Zr_xTi_{1-x})O_3$ and other members of the so called lead lanthanum zirconate titanate family can be used.

Preferably, the material used to form the electrode layers is an electrically conductive material having a high acoustic impedance. The electrodes may be comprised of for example any suitable metal, such as tungsten (W), aluminum (Al), copper (Cu), molybdenum (Mo), nickel (Ni), titanium (Ti), niobium (Nb), silver (Ag), gold (Au), and tantalum (Ta). The substrate is typically composed of for example Si, $SiO_2$, GaAs, glass, or ceramic materials.

The acoustical isolation can be produced with for example the following techniques:

with a substrate via-hole, with a micromechanical bridge structure, or with an acoustic mirror structure.

In the via-hole and bridge structures, the acoustically reflecting surfaces are the air interfaces below and above the devices. The bridge structure is typically manufactured using a sacrificial layer, which is etched away to produce a freestanding structure. Use of a sacrificial layer makes it possible to use a wide variety of substrate materials, since the substrate does not need to be modified very much, as in the via-hole structure. A bridge structure can also be produced using an etch pit structure, in which case a pit has to be etched in the substrate or the material layer below the BAW resonator in order to produce the free standing bridge structure.

FIG. 3 illustrates one example of various ways of producing a bridge structure. Before the deposition of other layers of the BAW structure, a sacrificial layer 135 is deposited and patterned first. The rest of the BAW structure is deposited and patterned partly on top of the sacrificial layer 135. After the rest of the BAW structure is completed, the sacrificial layer 135 is etched away. FIG. 3 shows also the substrate 200, a membrane layer 130, the bottom electrode 110, the piezoelectric layer 100, and the top electrode 120. The sacrificial layer can be realized using for example a metal or a polymer as the material.

In the via-hole structure, the resonator is acoustically isolated from the substrate by etching away the substrate from under a major portion of the BAW resonator structure. FIG. 4 illustrates a via-hole structure of a BAW resonator. FIG. 4 shows the substrate 200, a membrane layer 130, the bottom electrode 110, the piezoelectric layer 100, and the top electrode 120. A via-hole 211 has been etched through the whole substrate. Due to the etching required, via-hole structures are commonly realized only with Si or GaAs substrates.

A further way to isolate a BAW resonator from the substrate is by using an acoustical mirror structure. The acoustical mirror structure performs the isolation by reflecting the acoustic wave back to the resonator structure. An acoustical mirror typically comprise several layers having a thickness of one quarter wavelength at the center frequency, alternating layers having differing acoustical impedances. The number of layers in an acoustic mirror is typically an odd integer, typically ranging from three to nine. The ratio of acoustic impedance of two consecutive layers should be large in order to present as low acoustic impedance as possible to the BAW resonator, instead of the relatively high impedance of the substrate material. The material of the high impedance layers can be for example gold (Au), molybdenum (Mo), or tungsten (W), and the material of the low impedance layers can be for example silicon (Si), polysilicon (poly-Si), silicon dioxide ($SiO_2$), aluminum (Al), or a polymer. Since in structures utilizing an acoustical mirror structure, the resonator is isolated from the substrate and the substrate is not modified very much, a wide variety of materials can be used as a substrate. The polymer layer may be comprised of any polymer material having a low loss characteristic and a low acoustic impedance. Preferably, the polymer material is such that it can withstand temperatures of at least 350° C., since relatively high temperatures may be achieved during deposition of other layers of the acoustical mirror structure and other structures. The polymer layer may be comprised of, by example, polyimide, cyclotene, a carbon-based material, a silicon-based material or any other suitable material.

FIG. 5 shows an example of a BAW resonator on top of an acoustical mirror structure. FIG. 5 shows the substrate 200, the bottom electrode 110, the piezoelectric layer 100, and the top electrode 120. The acoustical mirror structure 150 comprises in this example three layers 150a, 150b. Two of the layers 150a are formed of a first material, and the third layer 150b in between the two layers is formed from a second material. The first and second materials have different acoustical impedances as described previously. The order of the materials can be varied. For example, the material with a high acoustical impedance can be in the middle and the material with a low acoustical impedance on both sides of the middle material, or vice versa. The bottom electrode may also be used as one layer of the acoustical mirror.

FIG. 6a shows a schematic diagram of a lattice filter structure constructed using bulk acoustic wave resonators. A lattice filter consisting of BAW resonators is usually designed so that two of the four resonators i.e. resonators A have higher resonance frequencies than the resonators B. Typically the series resonance of resonators A is at or close to the parallel resonance frequency of the resonators B, which is the center frequency of the filter. The difference in the resonance frequencies can be achieved for example in the same way as typically done in BAW filters having a ladder structure, namely by increasing the thickness of one of the layers of the B resonators or depositing an additional layer on top of the B resonators. The additional layer, sometimes called the tuning layer, can be either a metal or a dielectric layer. An example of the layout of such a lattice structure is shown in FIG. 6b. Typically, the size of the resonators is determined by the desired impedance level of the filter. The impedance level is determined mainly by the inherent shunt capacitance $C_0$ of the resonators, i.e. the capacitance between the top and bottom electrodes. An example of the frequency response of such a filter is shown in FIG. 7. One problem associated with such a structure is that the edges of the passband are not very steep, as can be observed from FIG. 7.

SUMMARY OF THE INVENTION

An object of the invention is to realize a filter structure having improved frequency characteristics. A further object of the invention is to provide a passband filter structure having very steep attenuation slope outside the passband as compared to prior art lattice filters.

The objects are reached by constructing a bulk acoustic filter structure with the lattice configuration, in which two of the resonators have a different area than other two for creating very steep passband edges in the frequency response of the filter. Preferably, the filter structure further comprises a second lattice structure for increasing the stopband rejection ratio of the filter structure, and for allowing the use of a simple mechanical structure. The cascaded configuration allows the construction of the filter structure in such a way, that the electrodes of the input and output port are at the same layer, thereby removing the need to make vias in the piezoelectric layer, which results in considerable simplification of the manufacturing process. Preferably, an acoustical mirror structure is used as the acoustical isolation in order to further simplify the mechanical structure of the filter structure.

The filter structure according to the invention is characterized by that, which is specified in the characterizing part of the independent claim directed to a filter structure. The mobile communication means according to the invention is characterized by that, which is specified in the characterizing part of the independent claim directed to a mobile communication means. The dependent claims describe further advantageous embodiments of the invention.

The novel features which are considered as characteristic of the invention are set forth in particular in the appended Claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

An embodiment of the invention will be described in detail below, by way of example only, with reference to the accompanying drawings, of which

A description of FIGS. 1 to 7 was given earlier in connection with the description of the state of the art. Same reference numerals are used for similar entities in the figures.

DETAILED DESCRIPTION

Figure 1:
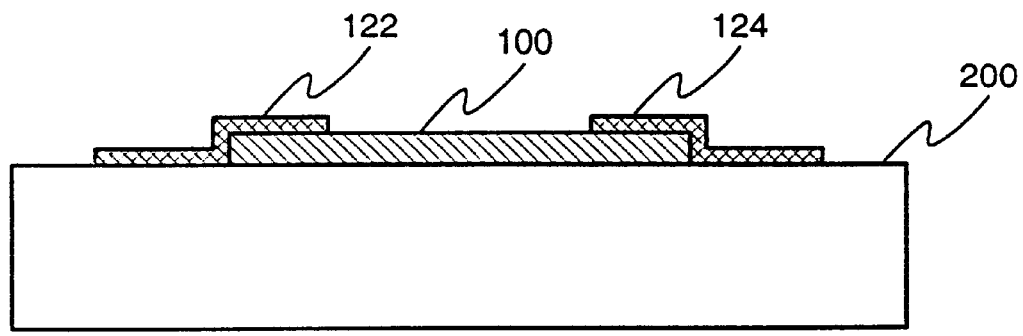
FIG. 1 illustrates a surface acoustic resonator according to prior art.
Figure 2:
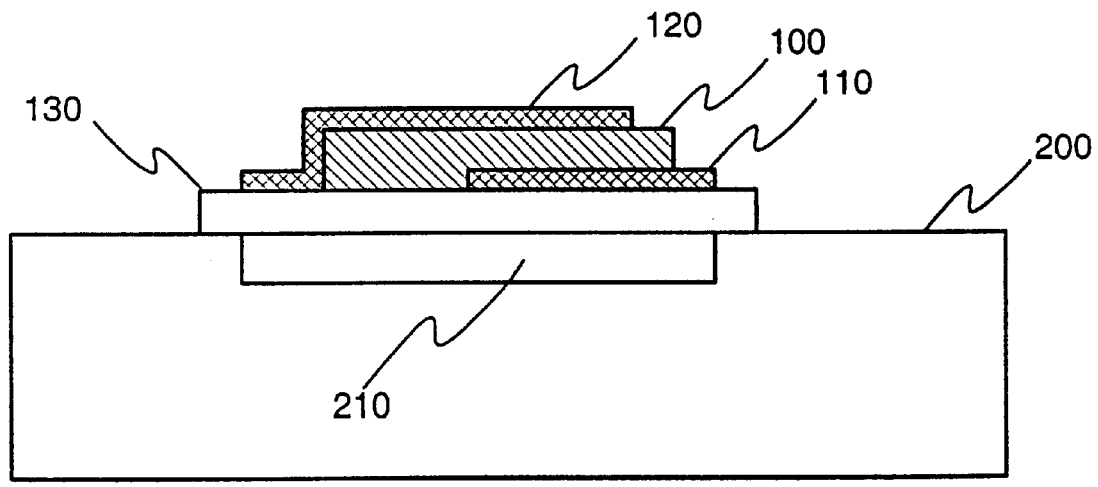
FIG. 2 illustrates a bulk acoustic wave resonator according to prior art.
Figure 3:
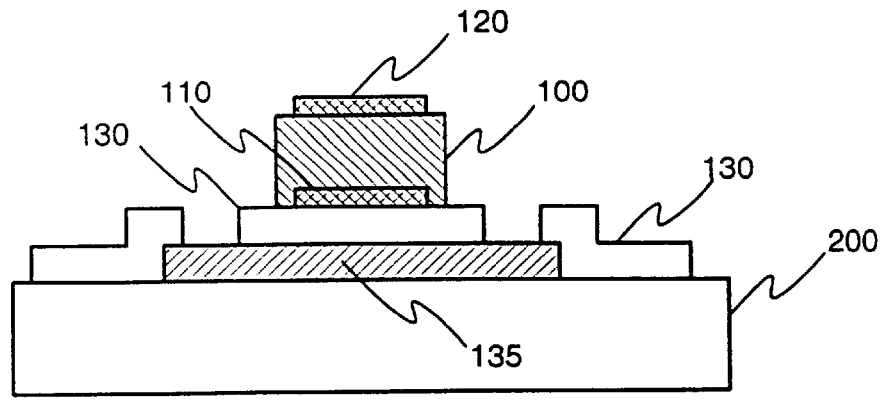
FIG. 3 shows another bulk acoustic wave resonator structure having a bridge structure.
Figure 4:
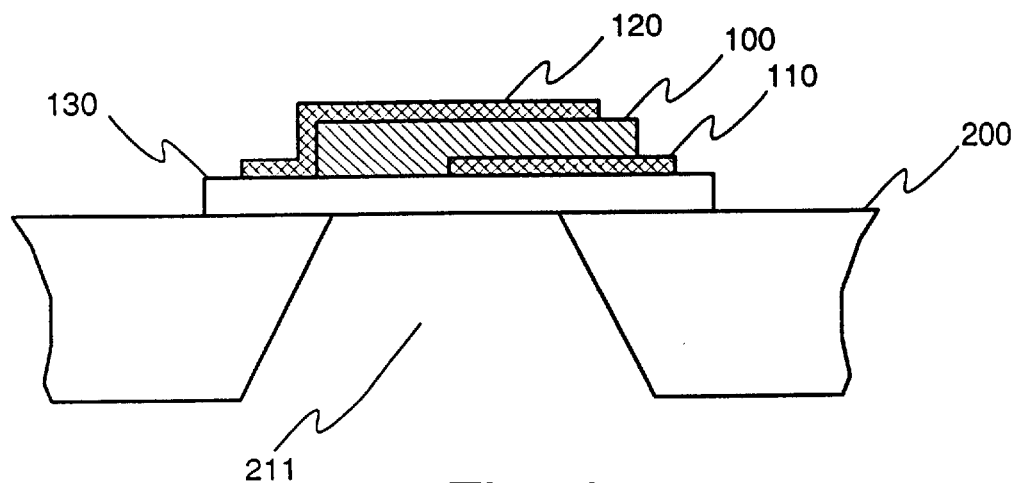
FIG. 4 illustrates a bulk acoustic wave resonator having a via-hole structure.
Figure 5:
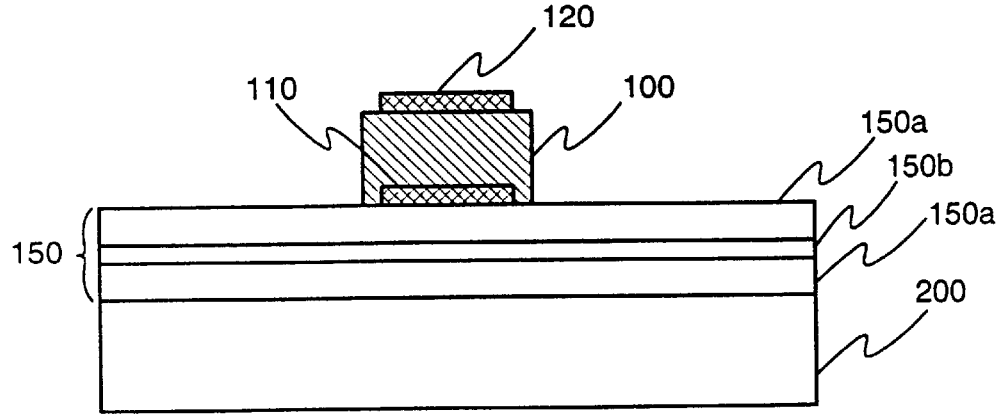
FIG. 5 illustrates a bulk acoustic wave resonator isolated from the substrate by an acoustic mirror structure.
Figure 6A:
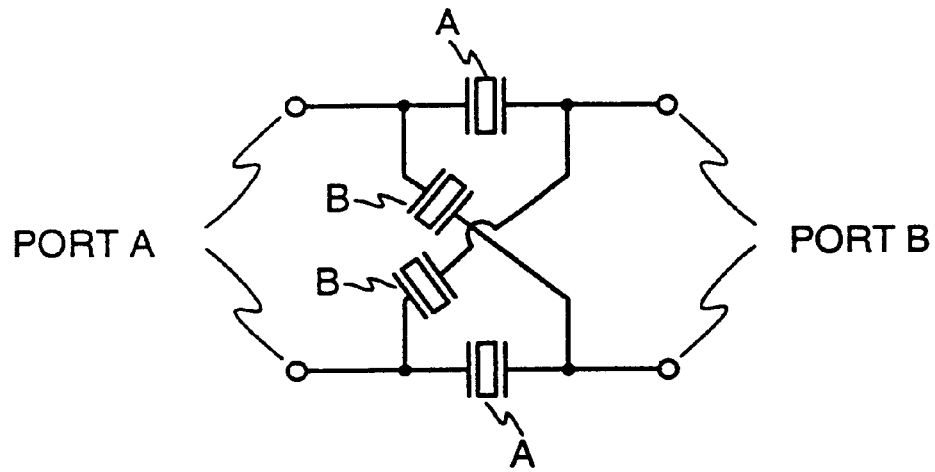
FIGS. 6a and 6b illustrate a prior art lattice structure realized using bulk acoustic wave resonators.
Figure 6B:
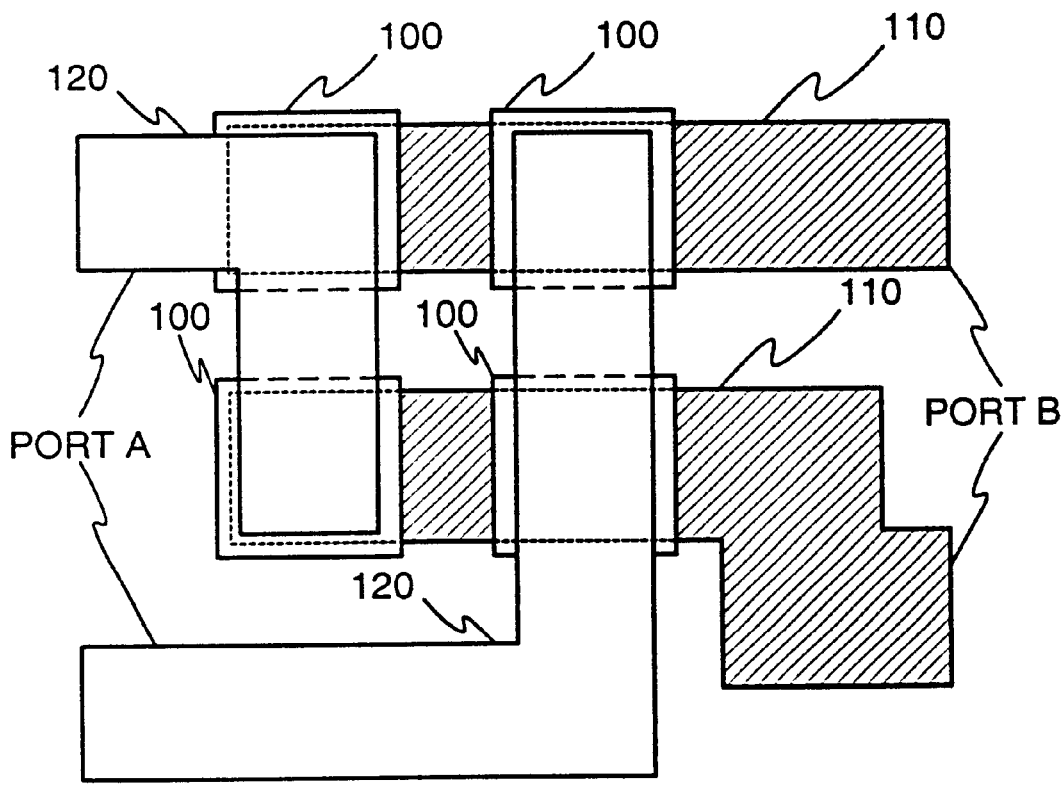

According to the invention, the filter structure comprises at least one lattice structure. Two of the four resonators of the lattice structure have a larger area than the other two. The resonators having a large area can be either the resonators marked with B in FIG. 6a or the resonators marked with A in FIG. 6a. In other words, the two resonators with a larger area comprise a first resonator connecting a first line of a first port PORT A to a first line of a second port PORT B, and a second resonator connecting a second line of the first port to a second line of the second port. In this specification and especially in the accompanied claims, the term area of a resonator refers to the cross sectional area of the resonator, the cross section being taken in a plane substantially parallel to the substrate surface.

Figure 8:
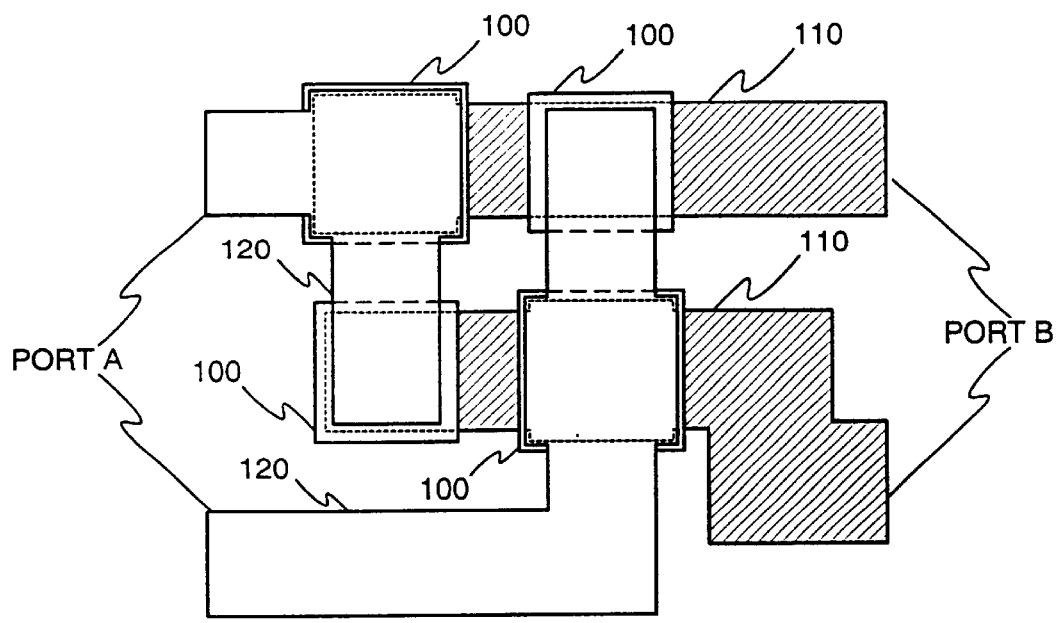
FIG. 8 illustrates a bulk acoustic wave filter structure according to an advantageous embodiment of the invention.

FIG. 8 illustrates an example of the mechanical structure of a filter according to an advantageous embodiment of the invention. FIG. 8 shows bottom electrodes 110, top electrodes 120, and piezoelectric layers 100 between the electrodes. Although in the example of FIG. 8 the piezoelectric layers of the four resonators are separate, in various embodiments of the invention the piezoelectric layers of the resonators may form a single continuous layer. In such an embodiment, the area of the resonator is defined substantially by the overlapping area of the top and the bottom electrodes at the location, where the overlapping occurs.

More specifically, FIG. 8 discloses a filter structure having a first signal line, a second signal line, a third signal line, and a fourth signal line, which structure comprises a first bulk acoustic wave resonator having substantially a first area, a second bulk acoustic wave resonator having substantially a first area, a third bulk acoustic wave resonator having substantially a second area, and a fourth bulk acoustic wave resonator having substantially a second area, wherein said first bulk acoustic wave resonator is connected between the first signal line and the third signal line, said second bulk acoustic wave resonator is connected between the second signal line and the fourth signal line, said third bulk acoustic wave resonator is connected between the first signal line and the fourth signal line, and said fourth bulk acoustic wave resonator is connected between the second signal line and the third signal line, said first area being substantially different from said second area. Further, the filter structure may comprise a first signal port comprising the first signal line and the second signal line and a second signal port comprising the third signal line and the fourth signal line.

Figure 9:
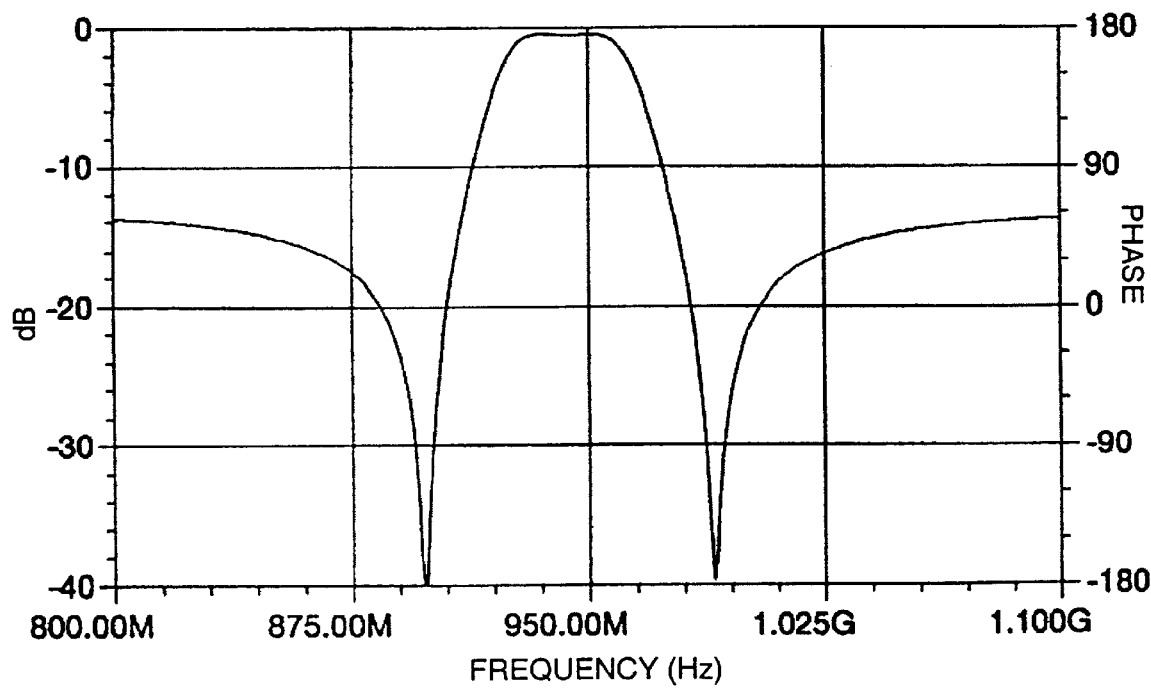
FIG. 9 shows an example of the frequency response of a structure according to FIG. 8.

The different relative sizes of the resonators A and B result in the frequency response close to passband being steeper than in prior art lattice structures. This is illustrated in FIG. 9, which shows an example of the frequency response of a lattice filter structure according to FIG. 8, in which the ratio of area of the A resonators to that of the B resonators is 1.2. As can be seen from FIG. 9, the attenuation increases more rapidly than in the prior art case shown in FIG. 7. However, the stop-band rejection is reduced at frequencies further away from the passband. This problem can however be solved by adding a second lattice stage to the filter structure.

Figure 7:
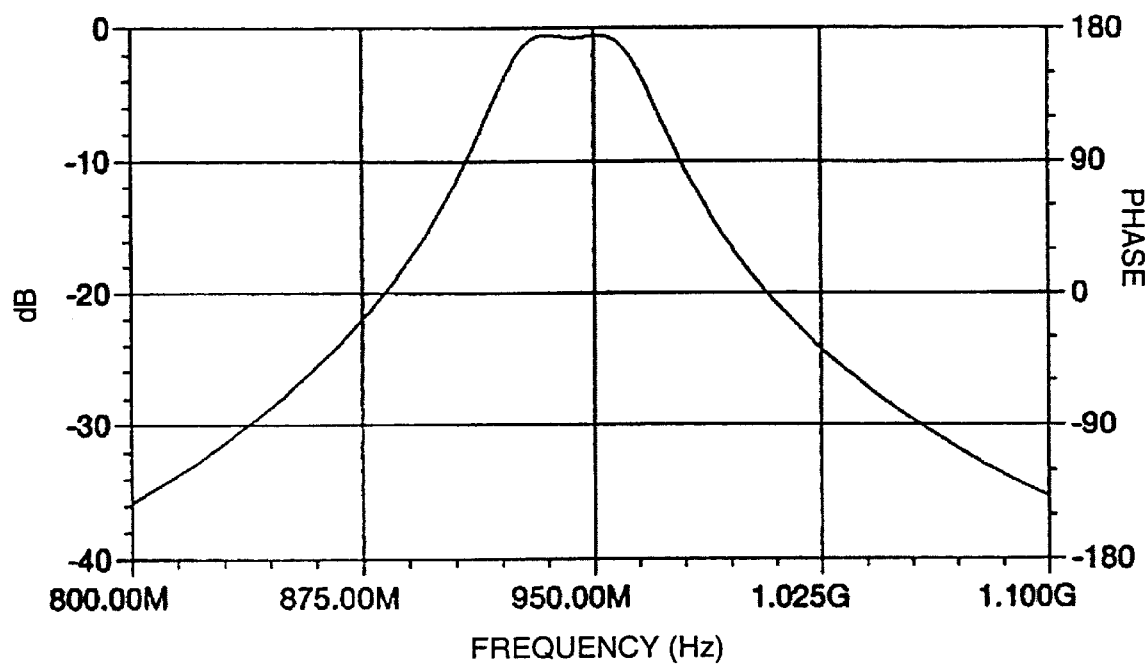
FIG. 7 shows the frequency response of the structure illustrated in FIGS. 6a and 6b.
Figure 10:
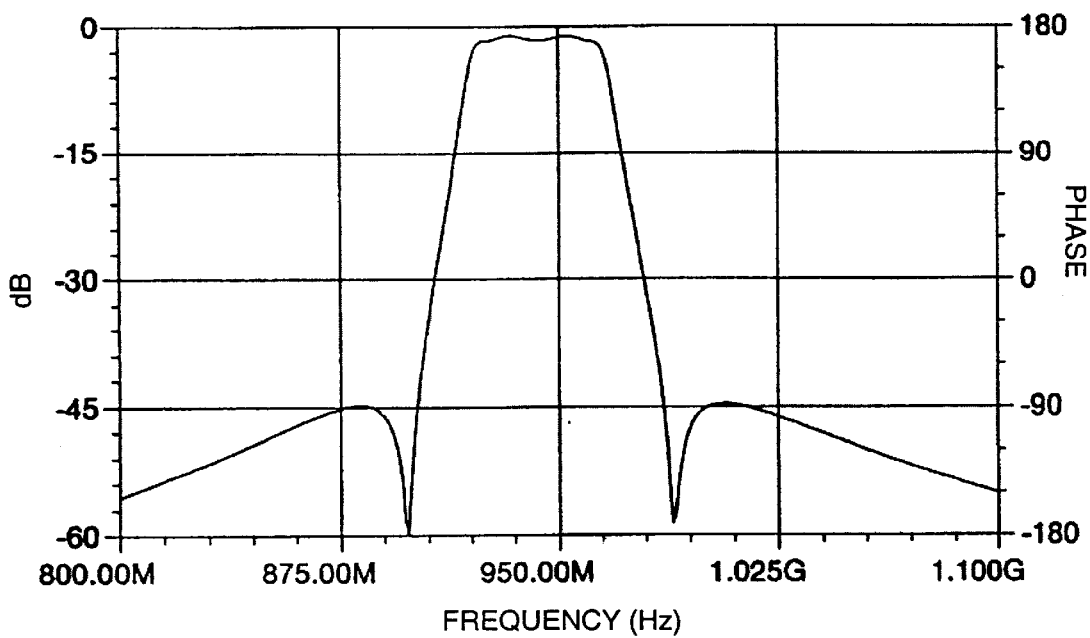
FIG. 10 illustrates the frequency response of a filter structure, in which a conventional lattice structure with identically sized resonators is cascaded with a filter structure according to FIG. 8.
Figure 11:
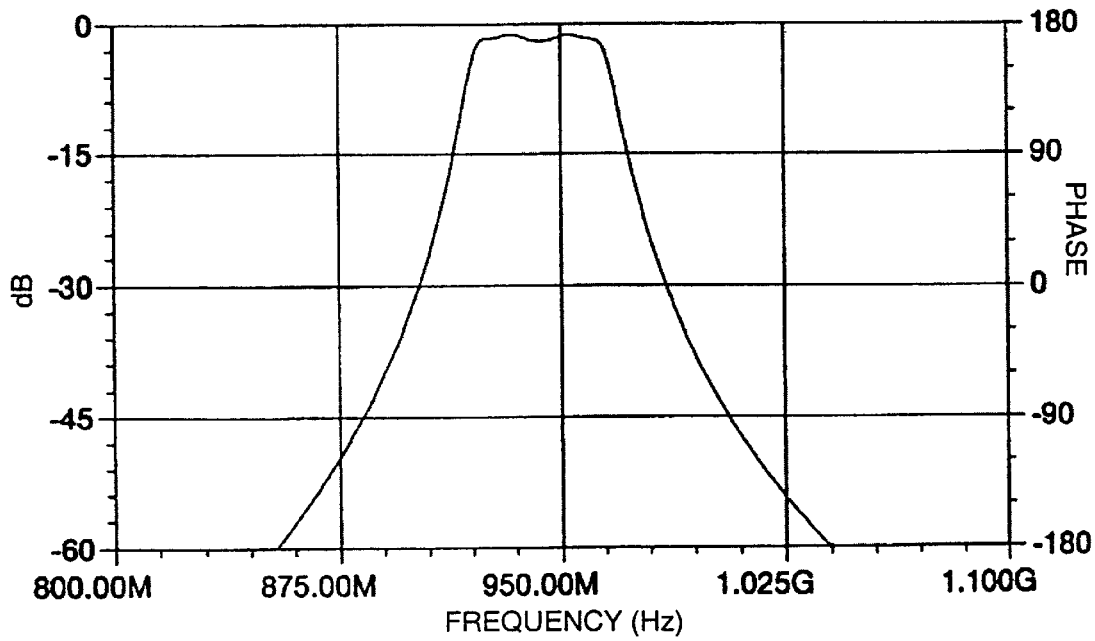
FIG. 11 shows an example of the frequency response of such a filter structure, which comprises two prior art lattice filters connected in series.

FIG. 10 illustrates the frequency response of a filter structure, in which a conventional lattice structure with identically sized resonators is cascaded with a filter structure according to FIG. 8. One may observe from FIG. 10, that the resulting frequency response has both very steep passband edges and good stop-band rejection. FIG. 11 shows the frequency response of a filter structure, which has two conventional lattice structures in series. One may observe from FIG. 11, that the passband edges are naturally steeper than in the case of one conventional lattice structure as shown in FIG. 7, but not as steep as in FIG. 10. Therefore, in an advantageous embodiment of the invention, the combined filter structure comprises one BAW lattice with two resonators having a different area than the two other resonators, and one BAW lattice with substantially identically sized resonators.

More specifically, a filter structure according to a further advantageous embodiment of the invention comprises a first bulk acoustic wave resonator having substantially a first area, a second bulk acoustic wave resonator having substantially a first area, a third bulk acoustic wave resonator having substantially a second area, and a fourth bulk acoustic wave resonator having substantially a second area, a fifth bulk acoustic wave resonator, a sixth bulk acoustic wave resonator, a seventh bulk acoustic wave resonator, an eighth bulk acoustic wave resonator, wherein said first bulk acoustic wave resonator is connected between the first signal line and the third signal line, said second bulk acoustic wave resonator is connected between the second signal line and the fourth signal line, said third bulk acoustic wave resonator is connected between the first signal line and the fourth signal line, and said fourth bulk acoustic wave resonator is connected between the second signal line and the third signal line, said fifth bulk acoustic wave resonator is connected between the third signal line and said fifth signal line, said sixth bulk acoustic wave resonator is connected between the fourth signal line and said sixth signal line, said seventh bulk acoustic wave resonator is connected between the third signal line and said sixth signal line, and said eighth bulk acoustic wave resonator is connected between the fourth signal line and said fifth signal line, said first area being substantially different from said second area. Further, such a filter structure advantageously comprises a first signal port comprising the first signal line and the second signal line and a second signal port comprising the fifth signal line and the sixth signal line.

Figure 12:
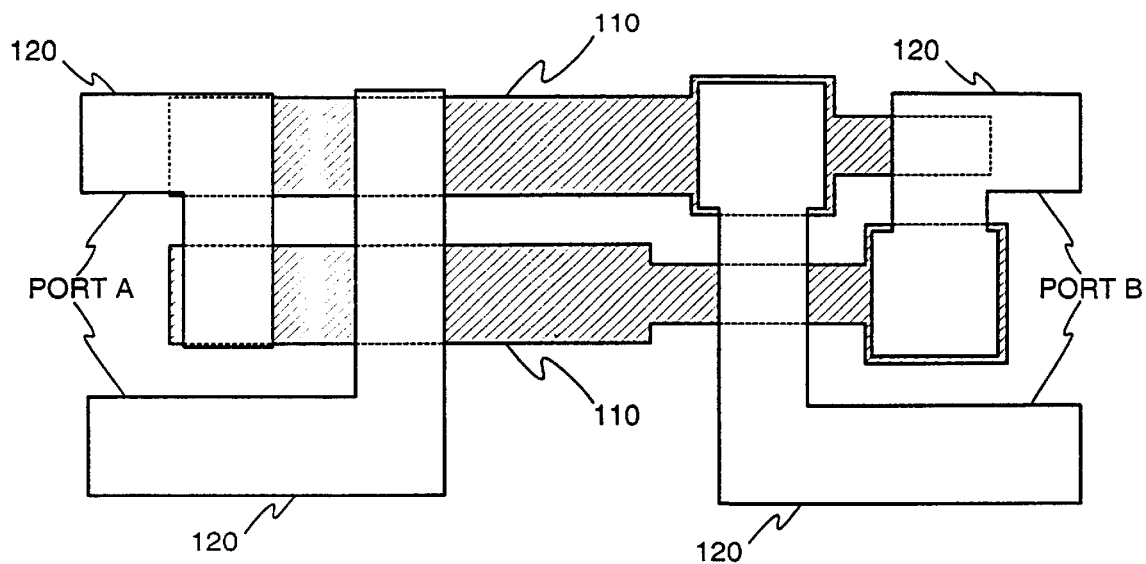
FIG. 12 illustrates the structure of a filter structure according to an advantageous embodiment of the invention, in which two lattice structures with resonators having different sizes are connected in series.

Said fifth, sixth, seventh, and eighth bulk acoustic wave resonators may have a substantially similar area. However, in other embodiments of the invention, two filters with the structure of FIG. 8 can be connected in series. Such an embodiment is illustrated in FIG. 12. FIG. 12 shows bottom electrodes 110 and top electrodes 120, and two signal ports PORT A, PORT B. For clarity, other layers such as the piezolayer are not illustrated in FIG. 12. In such an embodiment, said fifth bulk acoustic wave resonator has substantially a third area, said sixth bulk acoustic wave resonator has substantially a third area, said seventh bulk acoustic wave resonator has substantially a fourth area, and said eighth bulk acoustic wave resonator has substantially a fourth area, said third area being substantially different from said fourth area.

A substantial advantage of a cascaded topology such as that shown in FIG. 12 is that both the input and output ports PORT A, PORT B can be in the top electrode layer. This in turn makes it possible to leave the piezolayer unpatterned i.e. to allow the piezolayer to cover the whole substrate wafer, since there is no need to get access to the bottom electrode layer for making signal connections. Consequently, the number of required masks, processing time and cost are reduced. Such a topology can be used with most of the basic BAW structures described in this specification, but the simplest filter structure can be achieved by using BAW resonators having an acoustic mirror isolation. Realizing a cascaded topology with acoustical mirror isolation results in a simple structure having multiple high and low impedance layers for realizing the acoustic mirror structure, the bottom electrode layer, the piezolayer, top electrode layer, and a tuning layer on some of the resonators for creating the previously described resonance frequency deviations.

This layer structure has however only three layers that need to be patterned, i.e. the electrode layers and the tuning layer, resulting in a very low mask count and a fast and cheap fabrication process.

Figure 13:
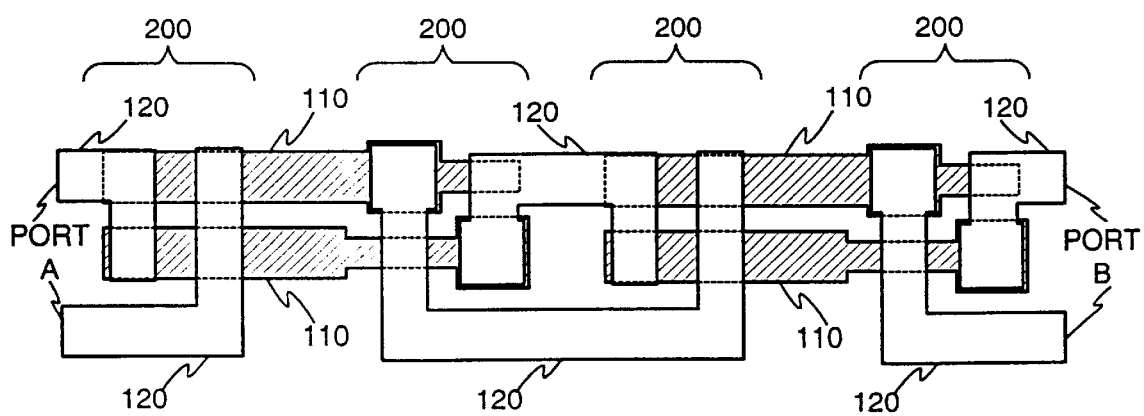
FIG. 13 illustrates the structure of such an embodiment of the invention, in which four lattice structures are connected in series.

A cascaded structure can be realized with a higher number of lattice structures as that shown in FIG. 12. FIG. 13 shows an example of a cascaded filter structure comprising four lattice sub-structures 200. As can be observed from FIG. 13, the cascaded topology creates the benefit of the input and output ports of the structure being in the same electrode layer in cases, where there is an even number of lattice sub-structures.

In a further advantageous embodiment of the invention, the cascaded topology is used in such a way, that the input and output electrodes are in the bottom electrode layer.

Figure 14:
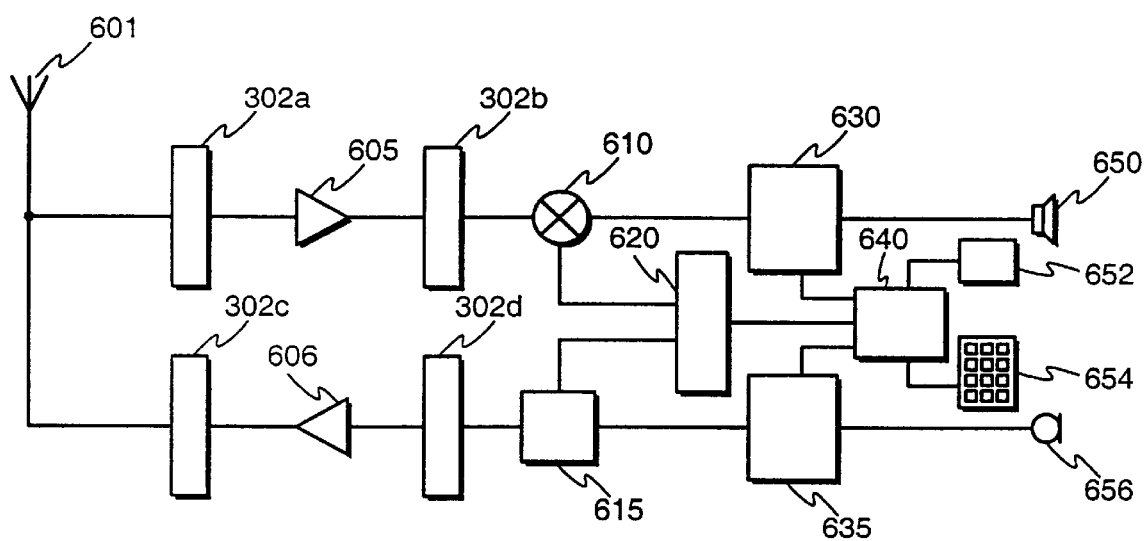
FIG. 14 shows a block diagram of a mobile communication means according to an advantageous embodiment of the invention.

In FIG. 14, a block diagram of a mobile communication means according to a further advantageous embodiment of the invention is shown. The receiver part of the mobile communication means comprises a first receiver filter bank 302a for filtering the received signal, a receiver amplifier 605 for amplifying the received signal, a second receiver filter bank 302b for further filtering of the received signal, a mixer 610 for converting the received signal to baseband, a receiver block 630 for demodulating and decoding the signal and an earpiece 650 or a loudspeaker 650 for producing the audible received signal. A filter bank typically consists of a plurality of filters and switches, whereby the desired filter is selected for use with the switches by the control block 640 of the mobile communication means. The number of filters and their properties in each filter bank can be selected according to the requirements of the particular application. The transmitter part comprises a microphone 656, a transmitter block 635 for coding the signal to be transmitted and performing other necessary signal processing, a modulator 615 for producing the modulated radio frequency signal, a first transmitter filter bank 302d, a transmitter amplifier 606, and a second transmitter filter bank 302c. The mobile communication means further comprises an antenna 601, an oscillator block 620, a control block 640, a display 652 and a keypad 654. The control block 640 controls the functioning of the receiver and transmitter blocks and the oscillator block, as well as displays information to the user via the display 652 and receives commands from the user via the keypad 654. The filters of the filter banks 302a, 302b, 302c, and 302d can have, for example, the structure shown in FIG. 8. Other inventive filter structures described in this specification can also be used in the filter banks 302a, 302b, 302c, and 302d. The receiver filter banks 302a, 302b are used to limit the noise and disturbing signals which the receiver receives from a receiving band. At the transmission side, the transmission filter banks 302c, 302d can clean up noise generated by the transmission circuitry outside the desired transmission frequencies. The oscillator block 620 may also comprise a filter block for removing unwanted noise from the output of the oscillator circuit.

The filter structure according to the invention has improved frequency characteristics as compared to lattice BAW filter structures of the prior art. More specifically, the inventive structures have a steeper attenuation slope outside the passband. Cascaded filter structures using acoustical mirror isolation as described for example in connection with FIG. 12 are also simple to manufacture, since the piezo layer does not need to be patterned, which reduces the number of required processing steps. Further, since in such embodiments the input and output ports of the filter are in the same layer, there is no need to fabricate vias through the piezo layer for making electrical connections from the top electrode layer to the bottom electrode layer, which increases the reliability of the structure.

Although the use of acoustical mirror isolated BAW resonators in cascaded lattice filter structures is advantageous due to the previously described simplicity of the structure and the simplicity of the fabrication process of such structures, the invention is in no way limited to only such structures. Any basic BAW structures, such as via-hole and bridge structures can be used in lattice filter structures according to various embodiments of the invention.

In further advantageous embodiments of the invention, resonator structures according to the invention are used in other types of small radio transmitter and/or receiver structures, where a small size of the components of the device is desired. For example, filter structures according to the invention can advantageously be used in in-building base stations of cordless telecommunications systems, such as cellular telecommunications systems or other types of cordless telephone systems. Further, filter structures according to the invention can advantageously be used for example in embedded radio link units in portable computers, personal digital assistants, and remote controlled devices.

According to a further advantageous embodiment of the invention, the substrate on which the resonator structures are deposited is used as a substrate, on which other components are attached. For example, the substrate may provide wiring connections for other components, which wiring connections are realized as electrically conducting patterns on the substrate surface. Components such as integrated circuits can subsequently be bonded on the substrate. For example, unpackaged integrated circuits can be bonded directly on the substrate using flipchip bonding technique. Such an embodiment is especially advantageous, when glass is used as the substrate material, since the low cost of glass substrates allow relatively large substrates to be produced, whereby such substrates can accommodate other components in addition to the deposited resonator structures.

The materials specified in the previously described examples of various embodiments of the invention are only examples, and a man skilled in the art can apply many other materials as well in the structures described in this specification. For example, high impedance layers of the acoustic mirror structure can be manufactured for example of metals like Au, Mo, or W. However, the high impedance layers are preferably manufactured of dielectric materials for example like ZnO, $Al_2O_3$, AlN, ZrN, $Si_3N_4$, diamond, carbon nitride, boron carbide, WC, $W_2C$, WC(4% Co), or other refractory metal carbides, $HfO_2$, $Y_2O_3$, $ZrO_2$, $Nb_2O_5$, $SnO_2$, $Ta_2O_5$, $TiO_2$, $CeO_2$, $IrO_2$, or other hard and heavy oxides. The low impedance layers of the acoustic mirror structure can be manufactured for example of materials like Si, poly-Si, $As_2S_3$, BN, B, graphite, $SiO_2$, NaCl, LiCl, polyimide, epoxy, nylon, polyethylene, polystyrene, and other carbon or silicone polymers. In embodiments, in which a sacrificial layer is used such as in a filter structure using bridge type BAW structures, the sacrificial layer may be realized using a wide variety of materials. For example, the sacrificial layer may be produced using copper (Cu) as the material. The polymer is preferably such a polymer, which can withstand the relatively high temperatures, that can be reached during the deposition of the other layers. The polymer may be, by example, polytetrafluoroethylene or a derivative thereof, polyphenylene sulfide, polyetheretherketone, poly(para phenylene benzobismidazole) poly(para phenylene benzobisoxazole), poly (para phenylene benzobismidazole), poly(para phenylene benzobisthiazole), a polyimide, polyimide siloxane, vinyle ethers, polyphenyl, parylene-n, parylene-f, or benzocyclobutene. The sacrificial layer may also be formed of any other material used in prior art, such as zinc oxide (ZnO). However, the use of a metal or a polymer is preferred as described previously.

In view of the foregoing description it will be evident to a person skilled in the art that various modifications may be made within the scope of the invention. While a preferred embodiment of the invention has been described in detail, it should be apparent that many modifications and variations thereto are possible, all of which fall within the true spirit and scope of the invention.

What is claimed is:

1. A filter structure having a first signal line, a second signal line, a third signal line, and a fourth signal line, characterized in that the structure comprises
    a first bulk acoustic wave resonator having substantially a first area,
    a second bulk acoustic wave resonator having substantially a first area,
    a third bulk acoustic wave resonator having substantially a second area, and
    a fourth bulk acoustic wave resonator having substantially a second area, and in that
        said first bulk acoustic wave resonator is connected between the first signal line and the third signal line,
        said second bulk acoustic wave resonator is connected between the second signal line and the fourth signal line,
        said third bulk acoustic wave resonator is connected between the first signal line and the fourth signal line, and
        said fourth bulk acoustic wave resonator is connected between the second signal line and the third signal line, and in that
    said first area is substantially different from said second area.

2. A filter structure according to claim 1, characterized in that the filter structure further comprises a first signal port comprising the first signal line and the second signal line and a second signal port comprising the third signal line and the fourth signal line.

3. A filter structure according to claim 1, characterized in that the filter structure further comprises
    a fifth signal line and a sixth signal line, and
    a fifth bulk acoustic wave resonator,
    a sixth bulk acoustic wave resonator,
    a seventh bulk acoustic wave resonator,
    an eighth bulk acoustic wave resonator, and in that
        said fifth bulk acoustic wave resonator is connected between the third signal line and said fifth signal line,
        said sixth bulk acoustic wave resonator is connected between the fourth signal line and said sixth signal line,
        said seventh bulk acoustic wave resonator is connected between the third signal line and said sixth signal line, and
        said eighth bulk acoustic wave resonator is connected between the fourth signal line and said fifth signal line.

4. A filter structure according to claim 3, characterized in that the filter structure further comprises a first signal port comprising the first signal line and the second signal line and a second signal port comprising the fifth signal line and the sixth signal line.

5. A filter structure according to claim 3, characterized in that
    said fifth bulk acoustic wave resonator has substantially a third area,
    said sixth bulk acoustic wave resonator has substantially a third area,
    said seventh bulk acoustic wave resonator has substantially a fourth area, and
    said eighth bulk acoustic wave resonator has substantially a fourth area, and in that
    said third area is substantially different from said fourth area.

6. A filter structure according to claim 3, characterized in that
    said fifth, sixth, seventh, and eighth bulk acoustic wave resonators have a substantially similar area.

7. A filter structure according to claim 3, characterized in that the filter structure further comprises an acoustical mirror structure.

8. A filter structure according to claim 3, characterized in that the piezo layers of said resonators comprise a single continuous material layer.

9. A filter structure according to claim 8, characterized in that the first, second, fifth and sixth signal lines are at the same side of the piezo layer.

10. Mobile communication means comprising a filter having a first signal line, a second signal line, a third signal line, and a fourth signal line, characterized in that the filter further comprises
    a first bulk acoustic wave resonator having substantially a first area, a second bulk acoustic wave resonator having substantially a first area, a third bulk acoustic wave resonator having substantially a second area, and a fourth bulk acoustic wave resonator having substantially a second area, and in that said first bulk acoustic wave resonator is connected between the first signal line and the third signal line, said second bulk acoustic wave resonator is connected between the second signal line and the fourth signal line, said third bulk acoustic wave resonator is connected between the first signal line and the fourth signal line, and said fourth bulk acoustic wave resonator is connected between the second signal line and the third signal line, and in that said first area is substantially different from said second area.

* * * * *